United States Patent
Suh

(10) Patent No.: US 7,359,252 B2
(45) Date of Patent: Apr. 15, 2008

(54) MEMORY DATA BUS STRUCTURE AND METHOD OF TRANSFERRING INFORMATION WITH PLURAL MEMORY BANKS

(75) Inventor: Jungwon Suh, Apex, NC (US)

(73) Assignee: Infineon Technologies AG, Neubiberg (DE)

( * ) Notice: Subject to any disclaimer, the term of this patent is extended or adjusted under 35 U.S.C. 154(b) by 111 days.

(21) Appl. No.: 11/327,354

(22) Filed: Jan. 9, 2006

(65) Prior Publication Data

US 2007/0162685 A1    Jul. 12, 2007

(51) Int. Cl.
G11C 7/10 (2006.01)

(52) U.S. Cl. .................................. 365/189.02; 365/63
(58) Field of Classification Search ................ 710/306, 710/316–317; 365/230.02, 18, 189.02, 63
See application file for complete search history.

(56) References Cited

U.S. PATENT DOCUMENTS

| 5,740,120 | A | 4/1998 | Okamura |
| 5,875,470 | A | 2/1999 | Dreibelbis et al. |
| 6,144,577 | A | 11/2000 | Hidaka |
| 6,226,723 | B1 | 5/2001 | Gustavson et al. |
| 6,787,859 | B2 | 9/2004 | Itou et al. |
| 2003/0179643 | A1* | 9/2003 | Winograd et al. .......... 365/233 |
| 2004/0141369 | A1* | 7/2004 | Noguchi ..................... 365/158 |

* cited by examiner

*Primary Examiner*—Clifford Knoll
(74) *Attorney, Agent, or Firm*—Edell, Shapiro & Finnan LLC

(57) ABSTRACT

A data bus structure for a dynamic random access memory (DRAM) according to the present invention includes a series of data buses, each shared by a plurality of memory banks, and a switching device to selectively couple the data buses to a global data bus to enable the memory device to provide and receive data. The data bus structure conserves space on a chip or die and prevents significant timing skews for data accessed from different memory banks.

20 Claims, 2 Drawing Sheets

MEMORY DATA BUS STRUCTURE AND METHOD OF TRANSFERRING INFORMATION WITH PLURAL MEMORY BANKS

BACKGROUND OF THE INVENTION

1. Technical Field

The present invention pertains to memory devices. In particular, the present invention pertains to a data bus structure for a dynamic random access memory (DRAM) that includes a series of data buses, each shared by a plurality of memory banks, and a switching device to selectively couple the data buses to a global data bus to enable the memory device to provide and receive data. The data bus structure conserves space on a chip or die and prevents significant timing skews for data accessed from different memory banks.

2. Discussion of the Related Art

Memory devices are utilized to store information for various applications. A commonly utilized memory device includes a dynamic random access memory (DRAM). These types of memory devices store information in memory cell arrays that are configured in a matrix of intersecting rows and columns. The rows are commonly referred to as word lines. Each memory cell generally includes a storage capacitor to hold a charge and a transistor to access the charge of the capacitor. The charge may be a high or low voltage potential (referred to as a data bit), thereby providing the memory cell with two logic states.

There are several forms of DRAM devices. For example, a double data rate (DDR) memory device provides increased performance and basically enables output operations to be performed on both the rising and falling edges of a clock signal. This effectively increases the clock frequency without actual alteration of the clock signal. A conventional DDR type DRAM device is illustrated in FIG. 1. Specifically, a memory device 10 is in the form of a chip or die and includes a plurality of cell arrays or memory banks 12a-12h each including a series of sub memory cell arrays 15 and corresponding sense amplifiers 16. The chip or die is typically substantially rectangular with the memory banks arranged in two rows of four banks with each row disposed along a respective longer dimensioned edge of the chip (e.g., memory banks 12a, 12b, 12e and 12f are disposed toward an upper chip edge and memory banks 12c, 12d, 12g and 12h are disposed toward a lower chip edge as viewed in FIG. 1). The memory device provides a storage capacity of one gigabit distributed evenly among memory banks 12a-12h (e.g., each memory bank includes a storage capacity of approximately one-hundred twenty-eight megabits).

Each memory bank is associated with a row decoder 14, a column decoder 18, a local data bus 20, secondary sense amplifiers 22, a write driver 23 and a bank data bus 24 (e.g., RWD0-RWD7 as viewed in FIG. 1). A column decoder and control area 21 is disposed below each memory bank 12a-12h and includes column decoder and control circuitry (e.g., column decoder 18, local data bus 20, secondary sense amplifiers 22, write driver 23, bank data bus 24, etc.) for that memory bank. The row decoders for two adjacent memory banks within a row are disposed next to each other along corresponding memory bank side edges. Thus, row decoders 14 of memory banks 12a, 12b are disposed next to each other between side edges of those memory banks, while the row decoders of memory banks 12e, 12f are similarly disposed next to each other and between side edges of those memory banks. The row decoders for adjacent memory banks 12c, 12d and 12g, 12h within the lower row are arranged in a similar fashion.

The row decoder enables a row (or word) within a corresponding memory bank in accordance with a provided memory address, while sense amplifiers 16 enable transference of information with individual memory cells. The column decoder selects corresponding sense amplifiers or columns for accessing particular memory cells in accordance with the provided address. Local data bus 20 transfers information between sense amplifiers 16 and secondary sense amplifiers 22 and write driver 23. The secondary sense amplifiers amplify the signals selected by the column decoder to drive bank data bus 24 during a read operation, while write driver 23 receives information from bank data bus 24 for a write operation as described below. Each bank data bus 24 is sixty-four bits wide and includes approximately the same length to extend through a corresponding column decoder and control area 21.

The memory device further includes a data peripheral circuit area 28 and an address/command peripheral circuit area 30. The data peripheral circuit area is disposed between the upper and lower rows of memory banks and extends from the chip side edge adjacent memory banks 12a, 12c to the approximate center of the chip. Data peripheral circuit area 28 typically includes a series of pads 34 arranged in two rows (e.g., DQ pads with an upper row disposed below memory bank 12b and a lower row disposed above memory bank 12d) to receive data into and provide data from the memory device, and inputs to receive a strobe (e.g., DQS) for double data rate operation and a data mask (e.g., DM) to selectively block write operations. Data peripheral circuit area 28 may further include circuitry to accommodate and/or process data to and from the memory device.

The address/command peripheral circuit area is disposed between the upper and lower rows of memory banks and extends from the chip side edge adjacent memory banks 12f, 12h to the approximate center of the chip. The address/command peripheral circuit area includes pads 36 arranged in two rows (e.g., ADD/CMD pads with an upper row disposed below memory bank 12e and a lower row disposed above memory bank 12g) to receive and provide address and commands for the memory device, and circuitry to process the address and commands.

In order to transfer data between the memory banks and pads 34, the memory device includes a global data bus 32 (e.g., SRWD as viewed in FIG. 1) coupled to pads 34. The global data bus is partially disposed in both peripheral circuit areas 28 and 30 (e.g., extends in the area between the upper and lower rows of pads 34 and 36 of respective areas 28, 30) and is sixty-four bits wide. The global data bus is further coupled to each bank data bus 24 via multiplexers 26, 27. Multiplexer 26 is coupled to the bank data buses associated with memory banks 12a-12d and is disposed in data peripheral circuit area 28 substantially coincident the adjacent row decoders for those memory banks. Multiplexer 27 is coupled to the bank data buses associated with memory banks 12e-12h and is disposed in address/command peripheral circuit area 30 substantially coincident the adjacent row decoders for those memory banks. Thus, each multiplexer may selectively couple one of four memory banks to the global data bus. Multiplexers 26, 27 selectively couple a bank data bus to global data bus 32 based on a memory address indicating the memory bank containing the desired memory cells for retrieval or storage of information. This enables information to be read from and written to the memory cells of memory banks 12a-12h.

The memory device provides a plurality of operations to access data. These operations include read and write operations to respectively retrieve and store data in specific memory cells. In order to read from or write to memory cells, the particular cells are selected or addressed. In addition, control information is received from a controller (e.g., a CPU, etc.) to indicate the type of operation (e.g., a write operation or a read operation) to be performed. With respect to a read operation, a row of memory cells in a particular memory bank is enabled by a row decoder 14 based on a provided memory address. The charges of the enabled memory cells are provided to corresponding sense amplifiers 16 that amplify the signals. Column decoder 18 selects the sense amplifiers associated with the desired memory cells based on the provided address, where the selected signals are placed on local data bus 20 for transference to secondary sense amplifiers 22. The secondary sense amplifiers amplify the received signals to place those signals on a corresponding bank data bus 24. The bank data bus is coupled to global data bus 32 via multiplexer 26 or 27 (e.g., depending upon the particular memory bank accessed as described above) for transference of the signals to pads 34. The pads enable peripheral circuitry to provide the signals as output from the memory device.

A write operation places data received by pads 34 (e.g., from peripheral circuitry receiving data from an external source) into desired memory cells. The data from pads 34 is placed on global bus 32 and transferred to a data bus 24 associated with the memory bank containing the desired memory cells via multiplexer 26 or 27 (e.g., depending upon the memory bank accessed). Write driver 23 transfers the data from data bus 24 to local data bus 20 for conveyance to sense amplifiers 16. The sense amplifiers store the data in the desired memory cells of the associated memory bank in conjunction with the row and column decoders.

The memory device described above suffers from several disadvantages. In particular, the architecture based on eight memory banks usually has a larger die size overhead than four bank architectures since the global data bus extends into the address/command peripheral circuit area. Further, the architecture described above employs two multiplexers to couple bank data buses to the global data bus (and pads). One multiplexer is disposed in the data peripheral circuit area adjacent the pads, while the other multiplexer is disposed in the address/command peripheral circuit area as described above. However, the distance for data to travel over the global data bus from the multiplexer disposed in the data peripheral circuit area to the pads is shorter than the distance for data to travel from the other multiplexer to those pads. This results in a significant or large data timing skew on the global data bus. In other words, the travel time for data from the respective multiplexers (and corresponding memory banks) varies. In addition, the architecture described above employs two multiplexers, thereby complicating signal routing in the peripheral circuit areas.

SUMMARY OF THE INVENTION

According to the present invention, an apparatus transports data within a memory device including a plurality of memory banks and a series of pads receiving information for and providing information from the memory device. The apparatus includes a plurality of bank data buses each associated with at least two of the memory banks to transfer information with those memory banks, a global data bus to transfer information with the series of pads to receive information for and provide information from the memory device, and a switching device coupled to the plurality of bank data buses and to the global data bus to selectively couple one of the bank data buses to the global data bus in accordance with a desired memory bank to access in order to transfer information between the series of pads and the desired memory bank. The embodiments of the present invention further include a method and a memory device for transporting data as described above.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION OF THE PREFERRED EMBODIMENTS

Figure 1:
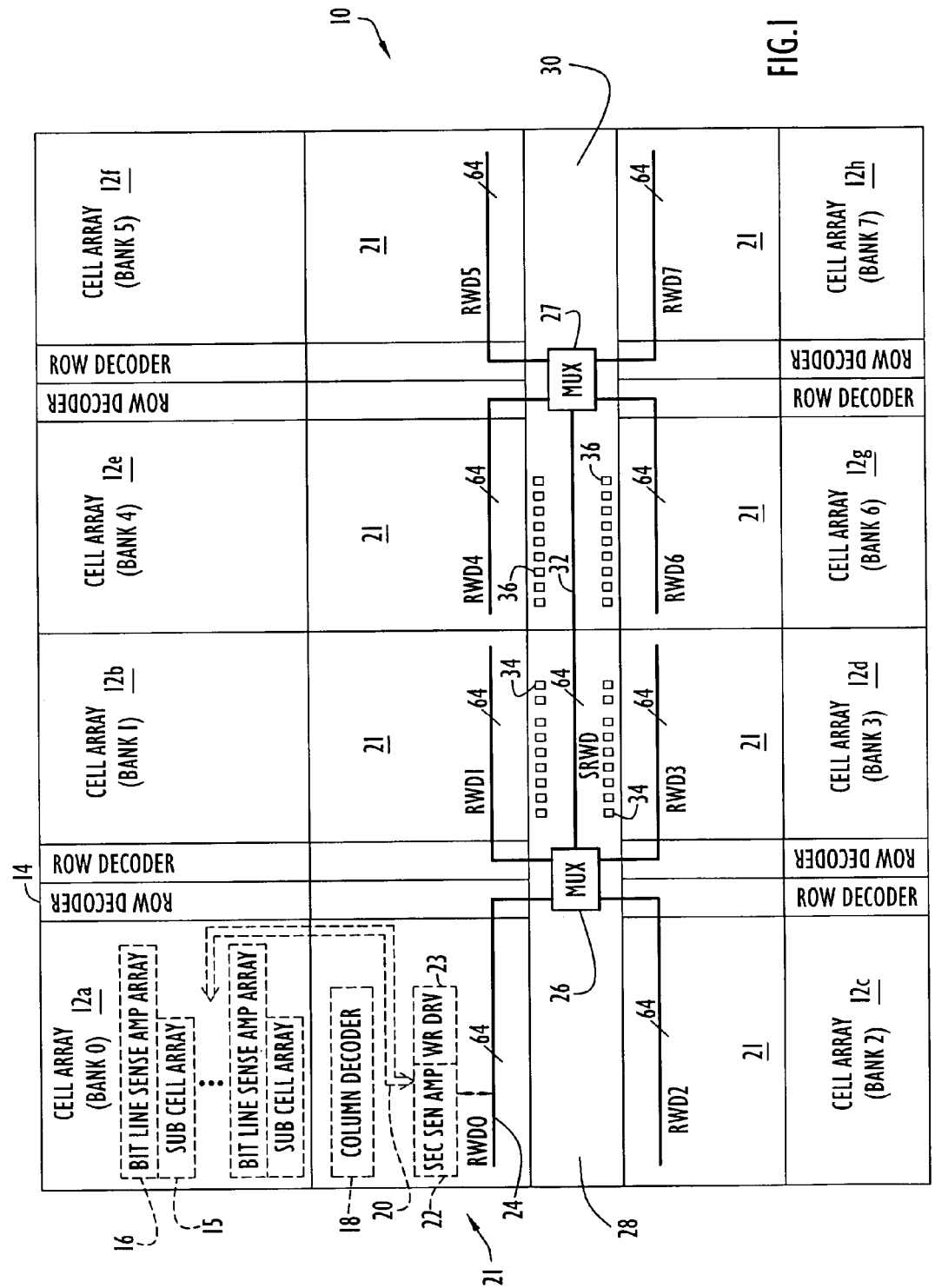
FIG. 1 is a schematic block diagram of a dynamic random access memory (DRAM) employing eight memory banks and a conventional data bus architecture.
Figure 2:
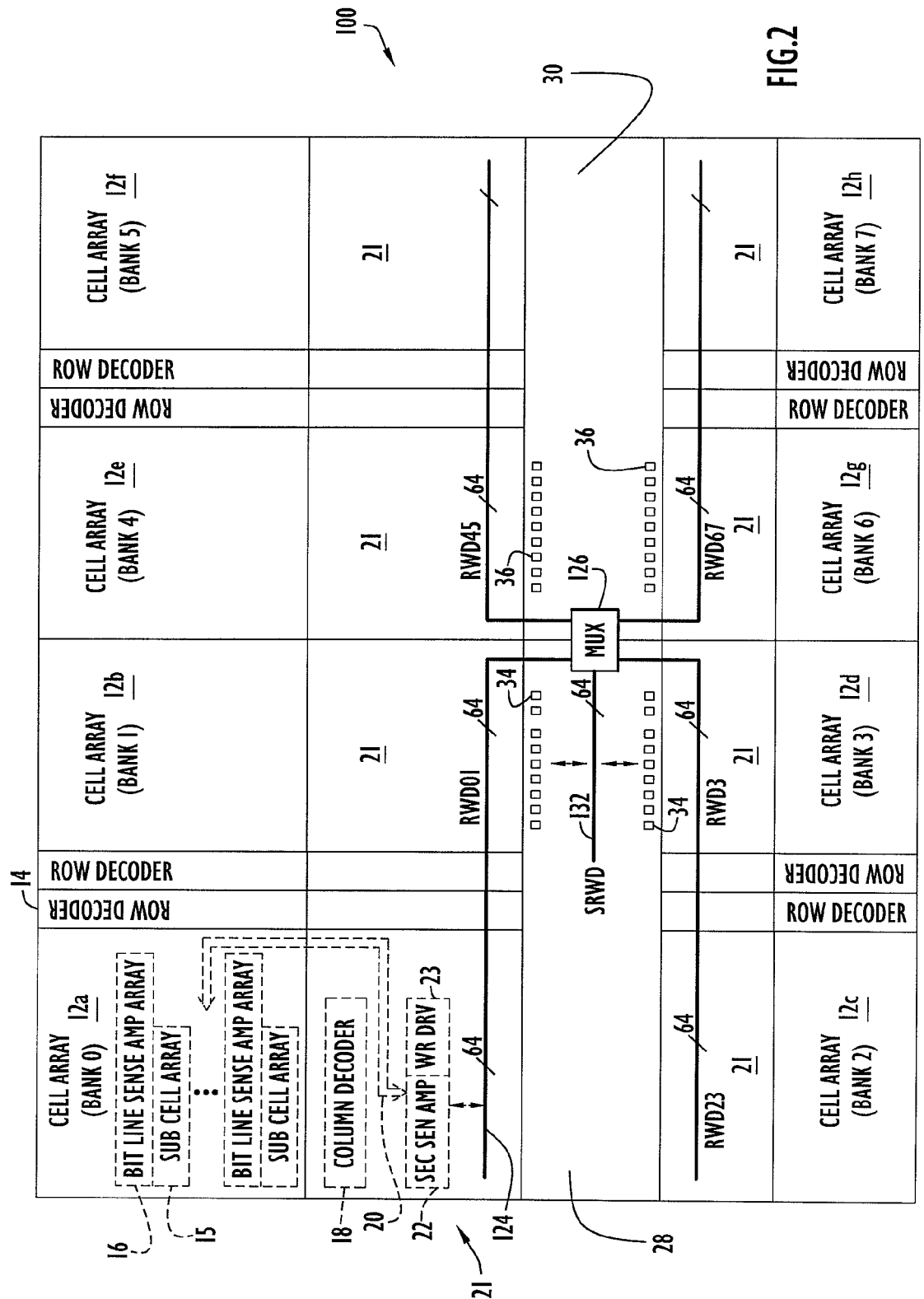
FIG. 2 is a schematic block diagram of an exemplary dynamic random access memory (DRAM) employing the data bus architecture according to the present invention.

The present invention pertains to a data bus structure for a dynamic random access memory (DRAM). The data bus structure conserves space on a chip or die and prevents significant timing skews for data accessed from different memory banks as described below. An exemplary dynamic random access memory (DRAM) employing a data bus architecture according to the present invention is illustrated in FIG. 2. Specifically, a memory device 100 is in the form of a chip or die and includes a plurality of cell arrays or memory banks 12a-12h each including a series of sub memory cell arrays 15 and corresponding sense amplifiers 16 as described above. By way of example, memory device 100 is a double data rate (DDR) type of memory device with eight memory banks; however, the memory device may be of any type and include any quantity of memory banks. The chip or die is typically substantially rectangular with the memory banks arranged in two rows of four banks with each row disposed along a respective longer dimensioned edge of the chip (e.g., memory banks 12a, 12b, 12e and 12f are disposed toward an upper chip edge and memory banks 12c, 12d, 12g and 12h are disposed toward a lower chip edge as viewed in FIG. 2). The memory device preferably provides a storage capacity of one gigabit distributed evenly among memory banks 12a-12h (e.g., each memory bank includes a storage capacity of approximately one-hundred twenty-eight megabits). The memory device may alternatively include any desired storage capacity distributed in any fashion among the memory banks.

Each memory bank is associated with a row decoder 14, a column decoder 18, a local data bus 20, secondary sense amplifiers 22 and a write driver 23, each as described above. Bank data buses 124 (e.g., RWD01, RWD23, RWD45 and RWD67 as viewed in FIG. 2) are further associated with the memory banks, where each adjacent memory bank pair (e.g., 12a-12b, 12c-12d, 12e-12f and 12g-12h) is associated with a corresponding bank data bus 124 (e.g., as viewed in FIG. 2: memory banks 12a-12b are associated with bus RWD01; memory banks 12c-12d are associated with bus RWD23; memory banks 12e-12f are associated with bus RWD45; and memory banks 12g-12h are associated with RWD67). The components (e.g., row decoder 14, sense amplifiers 16, column decoder 18, local data bus 20, secondary sense amplifiers 22, write driver 23, bank data buses 124, etc.) may be implemented by any conventional or other devices (e.g., circuitry, chips, buses, data transfer/transport devices, etc.) performing the functions described herein.

A column decoder and control area 21 is disposed below each memory bank 12a-12h and includes column decoder and control circuitry (e.g., column decoder 18, local data bus 20, secondary sense amplifiers 22, write driver 23, bank data bus 124, etc.) for that memory bank. The row decoders for two adjacent memory banks within a row are disposed next to each other along corresponding memory bank side edges. Thus, row decoders 14 of memory banks 12a, 12b are disposed next to each other between side edges of those memory banks, while the row decoders of memory banks 12e, 12f are similarly disposed next to each other and between side edges of those memory banks. The row decoders for adjacent memory banks 12c, 12d and 12g, 12h within the lower row are arranged in a similar fashion.

The row decoder enables a row (or word) within a corresponding memory bank in accordance with a provided memory address, while sense amplifiers 16 enable transference of information with individual memory cells. The column decoder selects corresponding sense amplifiers or columns for accessing particular memory cells in accordance with the provided address. Local data bus 20 transfers information between sense amplifiers 16 and secondary sense amplifiers 22 and write driver 23. The secondary sense amplifiers amplify the signals selected by the column decoder to drive a corresponding bank data bus 124 during a read operation, while write driver 23 receives information from the corresponding bank data bus 124 for a write operation as described below. Each bank data bus 124 is preferably sixty-four bits wide and includes substantially the same length to extend through the column decoder and control areas 21 of the corresponding adjacent memory banks utilizing that bank data bus. Bank data buses 124 include lengths greater than those of the bank buses of the conventional architecture and may alternatively accommodate or include a width of any quantity of bits (e.g., sixteen, thirty-two, one-hundred twenty-eight, etc.).

The memory device further includes data peripheral circuit area 28 and address/command peripheral circuit area 30, each as described above. The data peripheral circuit area is disposed between the upper and lower rows of memory banks and extends from the chip side edge adjacent memory banks 12a, 12c to the approximate center of the chip. Data peripheral circuit area 28 typically includes a series of pads 34 arranged in two rows (e.g., DQ pads with an upper row disposed below memory bank 12b and a lower row disposed above memory bank 12d) to receive data into and provide data from the memory device as described above. The pads may be of any quantity and may be implemented by any conventional or other devices (e.g., pads, contacts, terminals, etc.). Data peripheral circuit area 28 may further include inputs to receive a strobe (e.g., DQS) for double data rate operation and a data mask (e.g., DM) to selectively block write operations, and circuitry to accommodate and/or process data to and from the memory device as described above.

The address/command peripheral circuit area is disposed between the upper and lower rows of memory banks and extends from the chip side edge adjacent memory banks 12f, 12h to the approximate center of the chip. The address/command peripheral circuit area includes pads 36 arranged in two rows (e.g., ADD/CMD pads with an upper row disposed below memory bank 12e and a lower row disposed above memory bank 12g) to receive and provide address and commands for the memory device, and circuitry to process the address and commands as described above. The pads may be of any quantity and may be implemented by any conventional or other devices (e.g., pads, contacts, terminals, etc.).

In order to transfer data between the memory banks and pads 34, the memory device includes a global data bus 132 (e.g., SRWD as viewed in FIG. 2) coupled to pads 34. The global data bus may be implemented by any conventional or other data bus and is disposed in data peripheral circuit area 28 (e.g., extends in the area between the upper and lower rows of pads 34 of area 28). The global data bus is preferably sixty-four bits wide, but may accommodate or include a width of any quantity of bits (e.g., sixteen, twenty-eight, one-hundred twenty-eight, etc.). Since the global data bus includes a length less than that of the global data bus of the conventional architecture and completely resides within data peripheral circuit area 28, the corresponding space in the address/command circuit area for the global data bus is no longer needed (or becomes available for additional components). Consequently, the die or chip size may be reduced.

The global data bus is further coupled to each bank data bus 124 via a switching device or multiplexer 126. Multiplexer 126 is partially disposed in both data peripheral circuit area 28 and address/command peripheral circuit area 30 at a substantially central location on the chip. The switching device or multiplexer may be implemented by any conventional or other switching devices (e.g., circuitry, multiplexer, gate array, etc.). The multiplexer may selectively couple any of the memory banks to the global data bus based on a memory address indicating the memory bank containing the desired memory cells for retrieval or storage of information. This enables information to be read from and written to the memory cells of memory banks 12a-12h. The present invention architecture eliminates significant or large timing skews over the global data bus since the distance (or time required) for data to travel over the global data bus between centralized multiplexer 126 and pads 34 is substantially the same for each accessed memory bank.

Operation of memory device 100 is described. Initially, the memory device may provide a plurality of operations to access data. These operations include read and write operations to respectively retrieve and store data in specific memory cells. In order to read from or write to memory cells, the particular cells are selected or addressed. In addition, control information is received from a controller (e.g., a CPU, etc.) to indicate the type of operation (e.g., a write operation or a read operation) to be performed. With respect to a read operation, a row of memory cells in a particular memory bank is enabled by a row decoder 14 based on a provided memory address. The charges of the enabled memory cells are provided to corresponding sense amplifiers 16 that amplify the signals. Column decoder 18 selects the sense amplifiers associated with the desired memory cells based on the provided address, where the selected signals are placed on local data bus 20 for transference to secondary sense amplifiers 22. The secondary sense amplifiers amplify the received signals to place those signals on a corresponding bank data bus 124. Typically, one memory bank is accessed at a time to avoid conflicts or simultaneous access to a shared bank data bus 124. The bank data bus is coupled to global data bus 132 via multiplexer 126 for transference of the signals to pads 34. The pads enable peripheral circuitry to provide the signals as output from the memory device.

A write operation places data received by pads 34 (e.g., from peripheral circuitry receiving data from an external source) into desired memory cells. The data from pads 34 is placed on global bus 132 and transferred to a data bus 124 associated with the memory bank containing the desired memory cells via multiplexer 126. Write driver 23 of the desired memory bank transfers the data from data bus 124 to local data bus 20 for conveyance to sense amplifiers 16. The sense amplifiers store the data in the desired memory cells of the associated memory bank in conjunction with the row and column decoders.

The present invention provides several advantages including enhanced signal routing in the peripheral circuit area, reduced die or chip size and significantly reduced timing skews on the global data bus. In addition, the present invention architecture may be applied to memory devices with any quantity of memory banks (e.g., sixteen, twenty, twenty-four, etc.), where plural memory banks (e.g., four or more, etc.) may share a common bank data bus as described above.

It will be appreciated that the embodiments described above and illustrated in the drawings represent only a few of the many ways of implementing a memory data bus structure and method of transferring information with plural memory banks.

The present invention data bus architecture may be employed with any type of memory device (e.g., RAM, DRAM, ROM, DDR, dynamic, static, etc.) including any quantity of any types of memory banks with any desired storage capacities (e.g., kilobits, megabits, gigabits, etc.). The memory banks may include any types of memory cells (e.g., transistors, capacitors, etc.). The chip or die may be arranged in any fashion and may be of any shape or size. The components (e.g., memory banks, row decoders, column decoder, sense amplifiers, data buses, etc.) may be arranged on the chip or within the areas in any desired fashion and may be implemented by any conventional or other components (e.g., circuitry, chips, gates, logic, etc.) performing the functions described herein. The areas (e.g., peripheral circuit, column decode and control, etc.) may be of any quantity, shape or size, may be disposed on the chip at any locations and may include any components (e.g., circuitry, pads, buses, multiplexers, sense amplifiers, row and column decoders, etc.). The memory device may receive commands from any quantity of any type of external device (e.g., processor, controller, etc.).

The present invention data bus architecture may include any quantity of any types of buses (e.g., local, global, bank, etc.) of any desired capacity (e.g., any quantity of bits, etc.) and may be utilized to transfer any desired information (e.g., data, commands, addresses, etc.). The buses (e.g., bank data bus, global data bus, local data bus, etc.) may be implemented by any conventional or other buses or data transfer devices, and may be of any suitable lengths. The architecture may include any quantity of switching devices, where the switching devices may be implemented by any conventional or other devices (e.g., multiplexers, switches, gate array, logic, processor, etc.) to couple the bank and global data buses. The switching device may couple any quantity of memory banks or buses (e.g., the bank data buses) to any quantity of other buses (e.g., global data buses) based on any desired inputs or conditions (e.g., addresses, control signals, etc.). The pads (e.g., data and address/command) may be of any quantity, may be arranged and disposed on the chip in any fashion (e.g., in any area) and may be implemented by any conventional or other pads (e.g., contacts, terminals, etc.). The pads may be utilized to transfer any desired information (e.g., data, commands, addresses, control signals, etc.).

The present invention is not limited to the applications described above, but may be applied to any types of memory or other devices retrieving, storing and/or transporting data.

It is to be understood that the terms "top", "bottom", "front", "rear", "side", "height", "length", "width", "upper", "lower" and the like are used herein merely to describe points of reference and do not limit the present invention to any particular orientation or configuration.

From the foregoing description, it will be appreciated that the invention makes available a memory data bus structure and method of transferring information with plural memory banks, wherein a data bus structure for a dynamic random access memory (DRAM) conserves space on a chip or die and prevents significant timing skews for data accessed from different memory banks by employing a series of data buses, each shared by a plurality of memory banks, and a switching device to selectively couple the data buses to a global data bus to enable the memory device to provide and receive data.

Having described preferred embodiments of a new and improved memory data bus structure and method of transferring information with plural memory banks, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. An apparatus for transporting data within a memory device including a plurality of memory banks and a series of pads receiving information for and providing information from said memory device, said apparatus comprising:
   a plurality of bank data buses each associated with at least two of said memory banks to transfer information with those memory banks;
   a global data bus to transfer information with said series of pads to receive information for and provide information from said memory device; and
   a switching device coupled to said plurality of bank data buses and to said global data bus to selectively couple one of said bank data buses to said global data bus in accordance with a desired memory bank to access in order to transfer information between said series of pads and said desired memory bank.

2. The apparatus of claim 1, wherein said switching device includes a multiplexer.

3. The apparatus of claim 1, wherein said memory device includes eight memory banks.

4. The apparatus of claim 3, wherein said apparatus includes four bank data buses, with each bank data bus associated with two memory banks, and wherein said switching device selectively couples one of said four bank data buses to said global data bus.

5. The apparatus of claim 1, wherein said memory device includes a dynamic random access memory.

6. A method of transporting data within a memory device including a plurality of memory banks and a series of pads receiving information for and providing information from said memory device, said method comprising:

(a) associating each of a plurality of bank data buses with at least two of said memory banks to transfer information with those memory banks; and (b) transferring information between said series of pads and a desired memory bank by selectively coupling, via a switching device, said bank data bus associated with said desired memory bank to a global data bus that transfers information with said series of pads to receive information for and provide information from said memory device.

7. The method of claim 6, wherein said switching device includes a multiplexer, and step (b) further includes:

(b.1) selectively coupling, via said multiplexer, said bank data bus associated with said desired memory bank to said global data bus.

8. The method of claim 6, wherein said memory device includes eight memory banks.

9. The method of claim 8, wherein said plurality of bank data buses includes four bank data buses, and step (a) further includes:

(a.1) associating each of said four bank data buses with two of said memory banks to transfer information with those memory banks.

10. The method of claim 6, wherein said memory device includes a dynamic random access memory.

11. An apparatus for transporting data within a memory device including a plurality of memory banks and a series of pads receiving information for and providing information from said memory device, said apparatus comprising:

a plurality of transport means each associated with at least two of said memory banks for transferring information with those memory banks;

global transport means for transferring information with said series of pads to receive information for and provide information from said memory device; and switching means coupled to said plurality of transport means and to said global transport means to selectively couple one of said transport means to said global transport means in accordance with a desired memory bank to access in order to transfer information between said series of pads and said desired memory bank.

12. The apparatus of claim 11, wherein said switching means includes a multiplexer.

13. The apparatus of claim 11, wherein said memory device includes eight memory banks.

14. The apparatus of claim 13, wherein said apparatus includes four transport means, with each transport means associated with two memory banks, and wherein said switching means selectively couples one of said four transport means to said global transport means.

15. The apparatus of claim 1, wherein said memory device includes a dynamic random access memory.

16. A memory device comprising:

a plurality of memory banks;

a series of pads receiving information for and providing information from said memory device;

a plurality of bank data buses each associated with at least two of said memory banks to transfer information with those memory banks;

a global data bus to transfer information with said series of pads to receive information for and provide information from said memory device; and a switching device coupled to said plurality of bank data buses and to said global data bus to selectively couple one of said bank data buses to said global data bus in accordance with a desired memory bank to access in order to transfer information between said series of pads and said desired memory bank.

17. The memory device of claim 16, wherein said switching device includes a multiplexer.

18. The memory device of claim 16, wherein said memory device includes eight memory banks.

19. The memory device of claim 18, wherein said memory device includes four bank data buses, with each bank data bus associated with two memory banks, and wherein said switching device selectively couples one of said four bank data buses to said global data bus.

20. The memory device of claim 16, wherein said memory device includes a dynamic random access memory.

* * * * *